United States Patent [19]
King et al.

[11] Patent Number: 5,214,845
[45] Date of Patent: Jun. 1, 1993

[54] METHOD FOR PRODUCING HIGH SPEED INTEGRATED CIRCUITS

[75] Inventors: Jerrold L. King; Walter L. Moden; Chender Huang, all of Boise, Id.

[73] Assignee: Micron Technology, Inc., Boise, Id.

[21] Appl. No.: 881,456

[22] Filed: May 11, 1992

[51] Int. Cl.⁵ .................. H05K 3/30; H01L 23/28
[52] U.S. Cl. ........................... 29/841; 29/855;
174/52.2; 257/664; 257/668; 257/728
[58] Field of Search ............ 174/52.2, 52.3, 52.4;
357/72, 73; 29/825, 841, 854, 855, 856;
257/678, 684, 787, 790

[56] References Cited

U.S. PATENT DOCUMENTS

| | | | |
|---|---|---|---|
| 4,989,066 | 1/1991 | Sumi | 174/52.2 |
| 4,989,117 | 1/1991 | Hernandez | 174/52.2 |
| 5,053,852 | 10/1991 | Biswas et al. | 174/52.2 |

Primary Examiner—Leo P. Picard
Assistant Examiner—Bot L. Ledynh
Attorney, Agent, or Firm—Wayne E. Duffy

[57] ABSTRACT

This invention creates a high speed semiconductor interconnect system which contains a plurality of signal traces, each in a flexible printed circuit, and each adhesively sandwiched between or adjacent to a flexible ground circuit and a flexible power circuit. The signal, power and ground circuits are stacked in multilayers and are connected to respective lead fingers and respective die circuits by standard, known methods such as TAB or wire bond and encapsulated in a known way. The ground plane and power plane being adjacent to the signal plane reduces the power-ground loop inductance and thus reduces the package noise. By reducing the inductance, the circuit can have a shorter switching time. Also, by adding the ground plane, the power-ground capacitance is increased, which serves to reduce the effect of power supply fluctuations in the system.

4 Claims, 4 Drawing Sheets

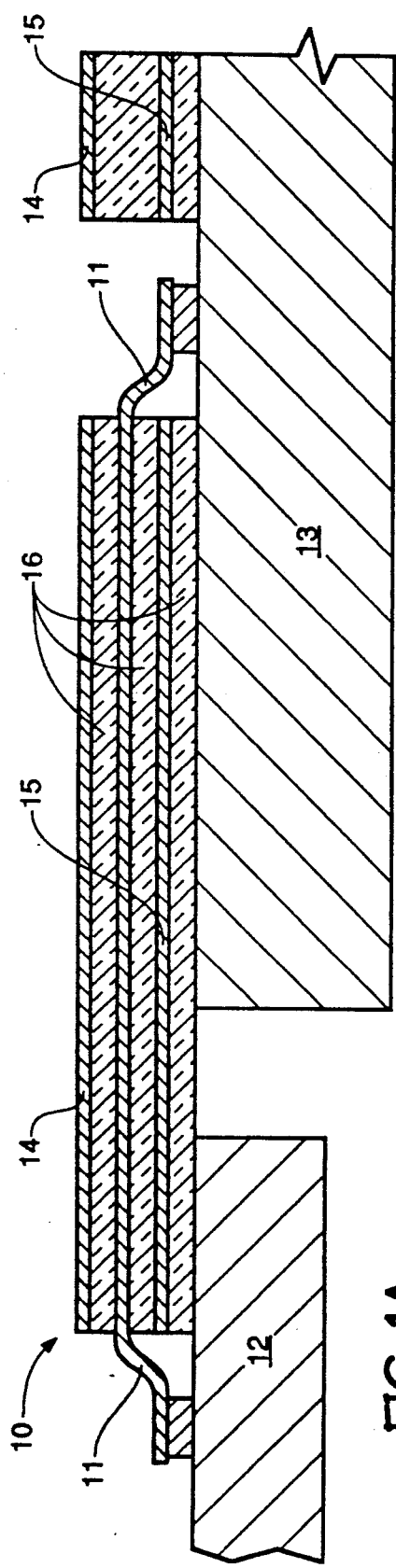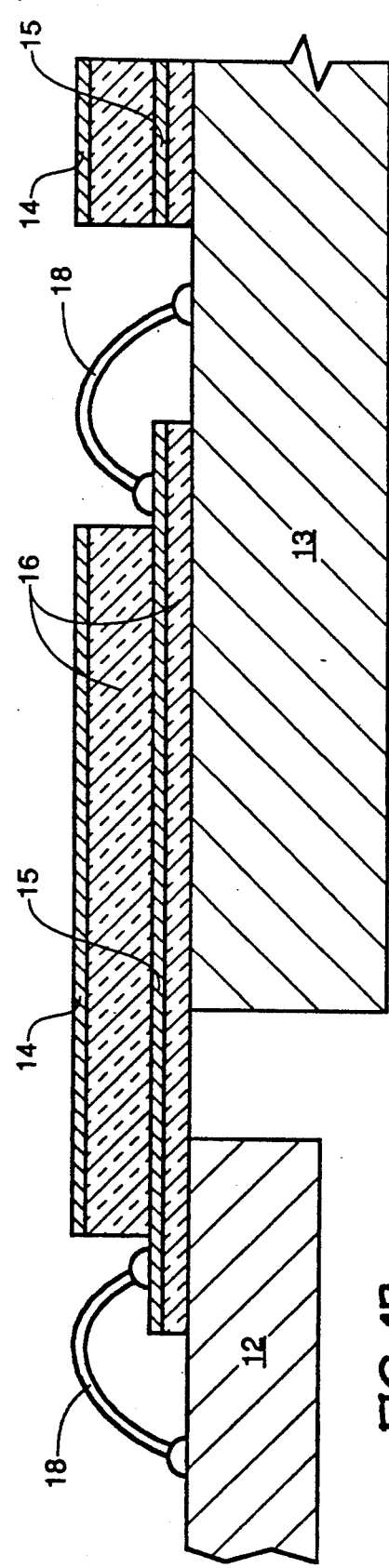

METHOD FOR PRODUCING HIGH SPEED INTEGRATED CIRCUITS

BACKGROUND OF THE INVENTION

The present invention relates to a system interconnect means to provide superior high speed integrated circuit assemblies.

DESCRIPTION OF PRIOR ART

Flexible printed circuits and multilayered lead frames such as those furnished by Intel/SHINKO are commonly known and serve well the purposes for which they were made. However there is continued effort in the industry to increase signal speed, reduce system noise and achieve high product quality.

SUMMARY OF THE INVENTION

This invention creates a semiconductor interconnect system which contains the signal traces sandwiched between or adjacent to a ground and a power plane. In the current signal layer package design the high inductance of the lead causes increased package noise in the power-ground path. Adding the power and ground planes reduces the power-ground loop inductance and thus reduces the package noise. By reducing the inductance, the circuit can have a shorter switching time, i.e. faster circuit and still have tolerable package noise. Also by adding the ground plane, the power-ground capacitance is increased. This serves to reduce the effect of power supply fluctuations on the assembly.

This invention uses a multilayer flex circuit that adheres to the die and the lead finger. In the preferred embodiments Kapton (TM) film with enclosed copper ribbon is used. The openings in the flex circuit at appropriate locations provide access to the bond pads and lead fingers for electrical connection. The perimeter of the film is attached to the lead fingers. The traces are then electrically connected to the lead fingers, i.e. multichip, A-wire, TAB. The package can then be sealed using conventional methods, such as plastic encapsulation. When wire bond is used to electrically connect tape to chip and tape to lead frame, silver or other oxidation resistant plating may be required on the copper surface of the tape bond area to minimize effects of oxidation on the surfaces.

By creating a semiconductor interconnect system which contains the signal traces sandwiched between or adjacent to a ground and a power plane, in a multilayer design, it is an intent of this invention to reduce lead inductance and increase power-ground capacitance, thereby increasing switching speed and reducing the effect of power supply fluctuations on the chips. It is a further intent of this invention to provide improved radiation shielding surrounding the circuit and thus reduce externally induced noise. It is a further intent to reduce the silicon area, provide narrow buss lines and permit greater freedom for placement of bond pads. Also inherent in the design of this invention is the advantage that existing equipment may be used to assemble the various parts of the integrated circuit. Furthermore this invention is compatible with existing package outlines and with ultra thin (0.5mm) package outlines. Tooling for lead frames is also reduced. One standard design can be used per package and the flex circuit may be changed to accommodate the die in the package.

DESCRIPTION OF THE DRAWINGS

FIG. 1A shows side detail of an encapsulated signal trace-lead finger connection, as seen in section 1—1 of FIG. 3A.

FIG. 1B shows side detail of an encapsulated wire attach-lead finger connection, as seen in section 2—2 of FIG. 3B.

DESCRIPTION OF PREFERRED EMBODIMENT

The preferred embodiments of this invention to be described herein consist primarily of obvious variations in the novel introduction and relation to each other, of a plurality of parallel planes of signal traces or wires, power planes and ground planes, in the novel design and construction of an improved semiconductor package.

Figure 2B:
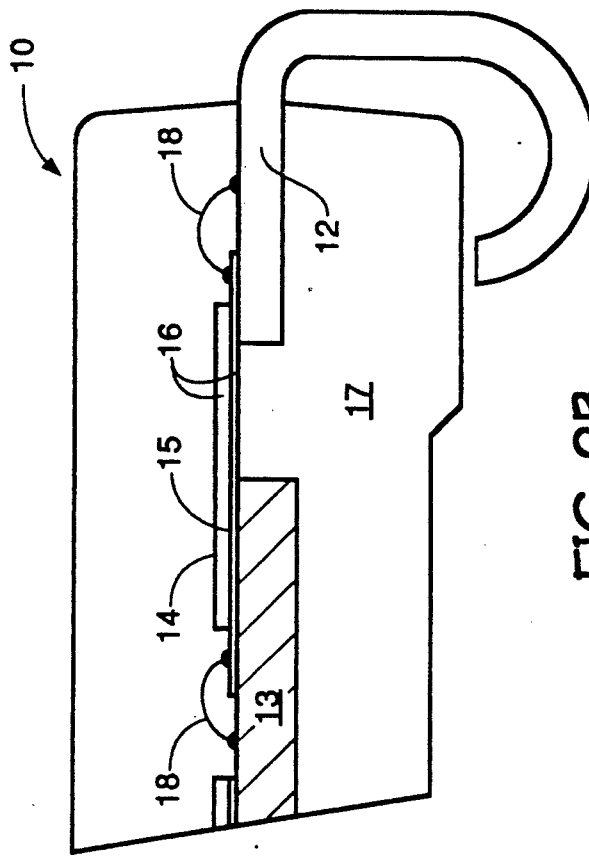
FIG. 2B is a side schematic view showing an encapsulated J-lead finger wire bonded to the laminated structure of the die with ground plane and power plane on opposing sides of the signal trace plane.
Figure 2A:
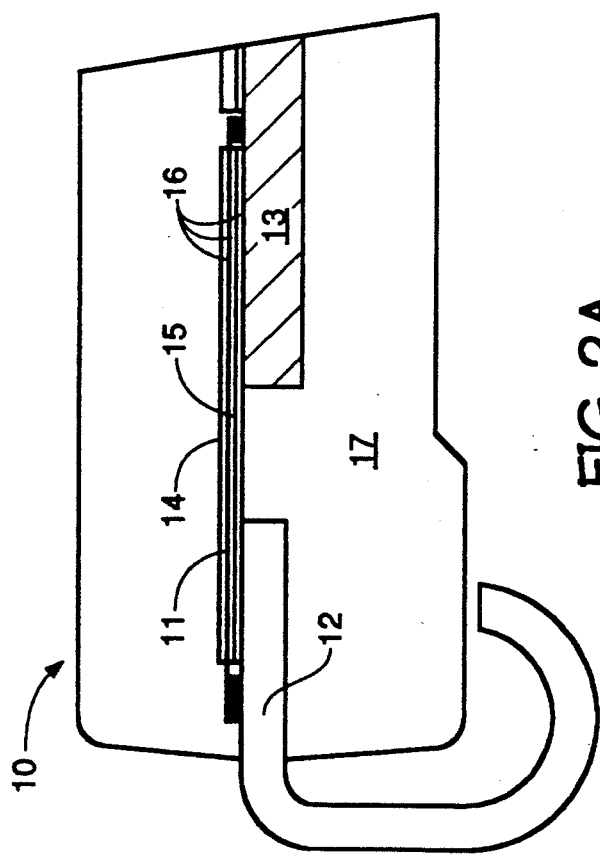
FIG. 2A is a side schematic view showing an encapsulated J-lead finger connected to a signal trace and to the die with the ground plane and power plane on opposing upper and lower sides of the signal trace.

Referring to FIG. 1A, which shows a preferred embodiment 10 in side detail, with a conductive signal trace 11 fixedly and operably attached, on one end, in a known way, to a lead finger 12 and on the opposing end to a die 13. Parallel to and on opposing upper and lower parallel surfaces, respectively, of signal trace 11 are attached a conductive ground plane 14 and a conductive power plane 15, which are of similar composition to the signal trace and in matching configuration with the signal trace. These three conductive planes are fixedly attached to each other in a preselected order by adhesive strips 16, the lower of which fixedly attached on one end to a lead finger and on the opposing end to a die. This is also illustrated in FIG. 2A, which shows the later plastic encapsulation 17 of the circuit.

Figure 3A:
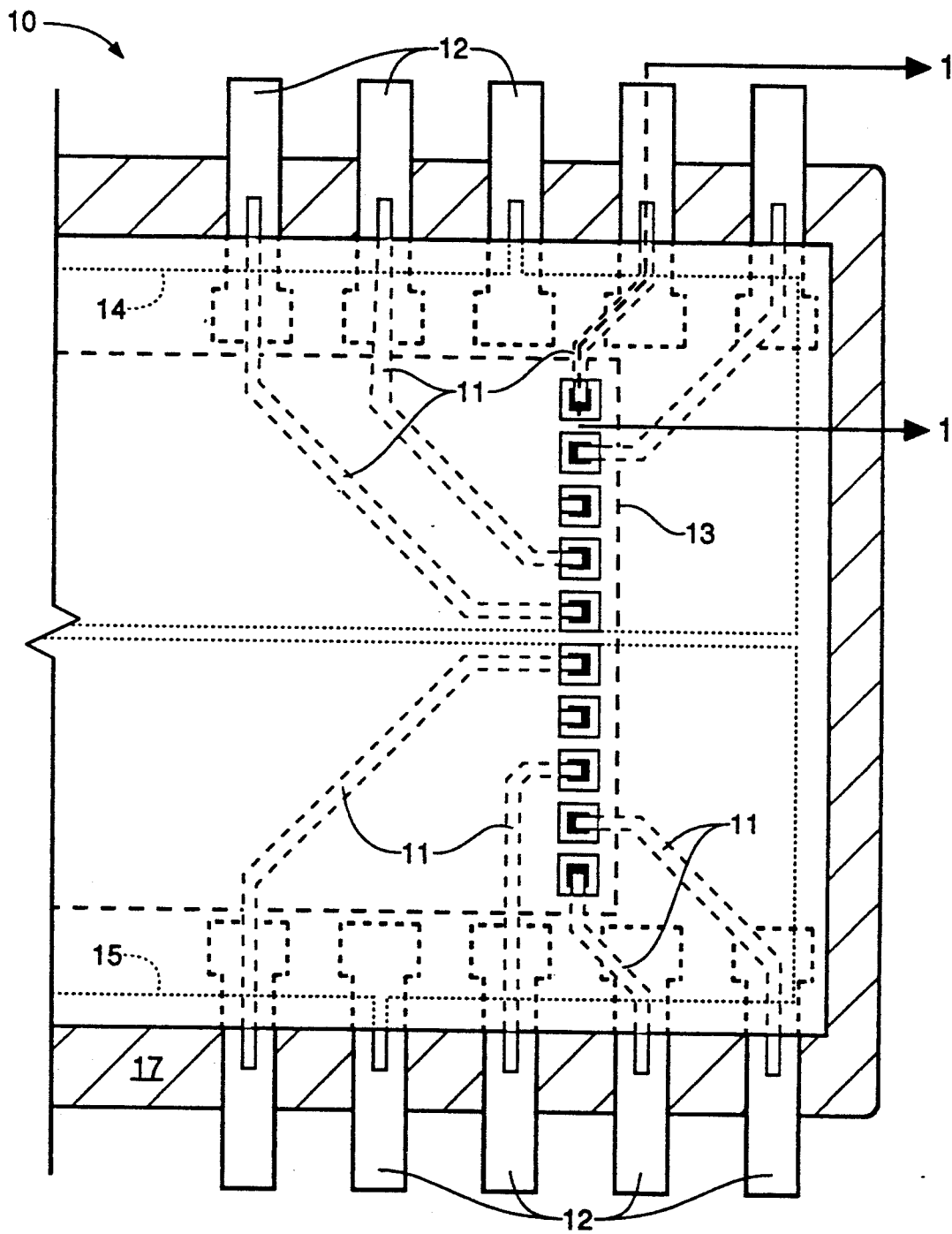
FIG. 3A is a top schematic view of an encapsulated die attach-signal trace-lead finger assembly with J-lead fingers attached on opposing sides.

Referring to FIG. 3A, a top view of the assembled circuit, the plurality of signal traces 11 each extend from their respective points of attachment on one end to the respective lead fingers, to their respective points of attachment on the opposing end, to the appropriate circuit points of the die. Openings made in the flex circuit at appropriate locations provide access to the bond pads and lead fingers for electrical connection, in a known way.

As illustrated in FIG. 3A, one of the lead fingers 12 on one side of the lead frame is in direct electrical contact with the conductive power plane 15 of the assembled die. A second lead finger 12 on the opposing side of the lead frame is in direct electrical contact with the conductive ground plane 14 of the assembled die. When the assembled die is encapsulated in plastic 17, in a known manner, the customary trim and form operations are performed, using standard manufacturing equipment and procedures, in a known way.

Referring to FIG. 1B, a second preferred embodiment shows, in side detail, a standard wire bond procedure whereby the plurality of individual wires 18 are attached, in a known way, to respective individual lead fingers 12 which are an integral part of a standard lead frame and are generally aligned in parallel spaced relationship to each other and on opposing parallel sides of a die-13 which is in the same horizontal plane. Each wire is connected, in a known way, to an appropriate circuit point on a die. The encapsulated circuit is shown in FIG. 2B.

Figure 3B:
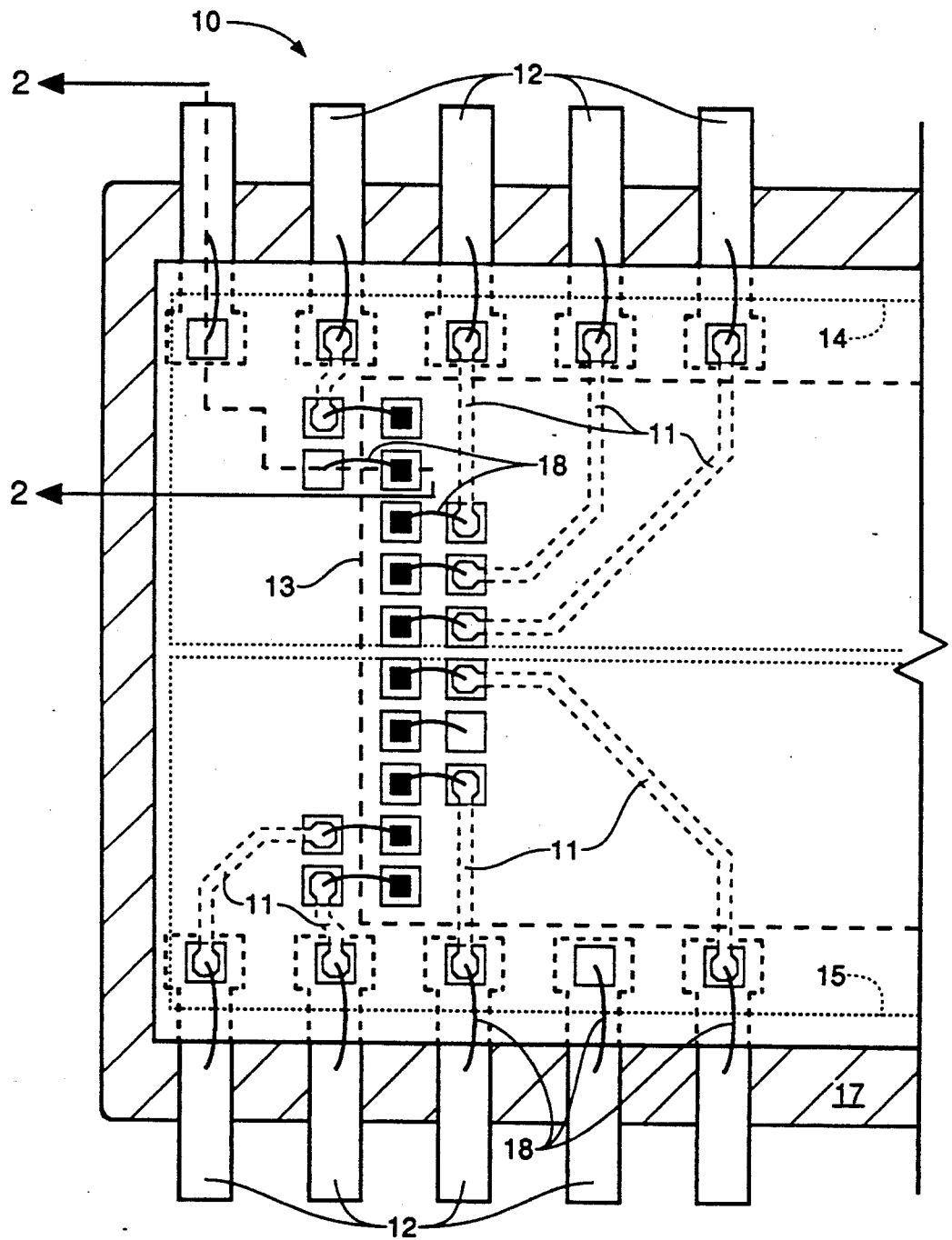
FIG. 3B is a top schematic view of an encapsulated die attach-wire bond assembly with J-lead fingers wire attached on opposing sides.

Referring to FIG. 3B, a top view of the assembled circuit, one of the lead fingers on one side of the lead frame is in direct electrical contact, through a hole in the flex circuit, with the conductive power plane 15 of the assembled die. A second lead finger on the opposing side of the lead frame is in direct electrical contact, through a hole in the flex circuit, with the ground plane 14 of the assembled die. The die is then encapsulated in plastic, in a known manner, and the customary trim and form operations are performed, using standard manufacturing equipment and procedures.

The present invention has been described in two preferred embodiments, using tape automated bonding (TAB) and A-wire bonding with current technology and a novel combination of signal trace, ground plane and power plane to reduce lead inductance and increase power-ground capacitance, thereby increasing switching speed and reducing the effect of power supply fluctuations on the chips. Many modifications and variations may become apparent to those skilled in the art. However the scope of the invention is not limited by the above described details but only by the appended claims.

We claim:

1. An improved interconnect method for producing high speed integrated circuits, comprising:

a) stacking and laminating together in planar relationship and matching configuration with each other, a plurality of multilayered series of flexible electroconductive printed circuits, multilayered series of flexible electroconductive printed circuits, each of selected design, by means of a plurality of adhesive films of suitable composition, one each of which is attached to the bottom of the stack of multilayered series of printed circuits and between each of the multilayers of the series of circuits and with one edge of the bottom layer of adhesive film being attached to the plurality of lead fingers on one side of a lead frame and the opposing edge of the bottom layer of adhesive film being attached to the plurality of lead fingers on the opposing side of the lead frame, with a plurality of die of selected design, each being located between the opposing lead fingers and also attached to the top surface of the die to the bottom layer of adhesive film;

b) having each multilayered series of flexible printed circuits contain a plurality of electrical signal plane circuits and a plurality of electrical power plane circuits and a plurality of electrical ground plane circuits, stacked and adhesively attached to each other in alternating order, with each signal plane circuit having attached proximate thereto and combined electrically therewith, externally, in an appropriate manner, a power plane circuit and a ground plane circuit to reduce the power to ground loop inductance and increase the power to ground capacitance of the signal plane circuit, thus reducing circuit noise and switching time and power supply fluctuations in the signal circuits;

c) having each multilayered series of flexible printed circuits contain a signal trace circuit with a ground plane circuit and a power plane circuit adhesively attached proximate thereto, with selected points on one end of the signal trace circuit being attached, through appropriate openings in the multilayer flexible circuit, to appropriate lead fingers on the lead frame and attached on the other end to selected points on the attached die and with the proximate ground plane circuit and power plane circuit each being attached, through appropriate openings in the multilayer flexible circuits, to appropriate lead fingers on the lead frame and attached on the other end of the signal trace circuit to selected points on the attached die and with the proximate ground plane circuit and power plane circuit each being attached, through appropriate openings in the multilayer flexible circuits, to appropriate lead finger on the lead frame, thus completing a power to signal to ground system for a particular integrated circuit; and d) encapsulating and trimming and forming the plurality of multilayered series of flexible printed circuits and die and lead frames in proper sequence on other existing equipment and thus completing the improved interconnect method for high speed integrated circuits.

2. The improved interconnect method of producing high speed integrated circuits of claim 1, wherein:

the signal trace circuits within the plurality of multilayered series of flexible electroconductive printed circuits are connected on opposing ends, through appropriate openings in the flexible circuits, by wire bonding to the respective, selected lead fingers on the lead frame and the respective, selected circuit points on the die.

3. The improved interconnect method for producing high speed integrated circuits of claim 1 wherein the adhesive layer is thermoplastics in nature and composition.

4. The improved interconnect method for producing high speed integrated circuits of claim 1 wherein the adhesive layer is thermosetting in nature and composition.

* * * * *